(12) United States Patent
Sim et al.

(10) Patent No.: US 7,480,748 B2
(45) Date of Patent: Jan. 20, 2009

(54) PRINTED CIRCUIT BOARD (PCB) HAVING A PLURALITY OF INTEGRATED CIRCUITS (ICS) INTERCONNECTED THROUGH ROUTING PINS IN ONE CENTRAL INTEGRATED CIRCUIT

(75) Inventors: Dae-Hyun Sim, Seoul (KR); Kang-Hoon Lee, Yongin-si (KR); Cheong-Sun Lee, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 367 days.

(21) Appl. No.: 11/391,590

(22) Filed: Mar. 28, 2006

(65) Prior Publication Data
US 2007/0005843 A1  Jan. 4, 2007

(30) Foreign Application Priority Data
May 10, 2005  (KR) .................... 10-2005-0038864

(51) Int. Cl.
*G06F 13/38* (2006.01)

(52) U.S. Cl. .................. 710/38; 710/8; 710/9; 710/10; 361/680; 361/683; 361/760

(58) Field of Classification Search ............... 710/8–10, 710/38; 361/680, 683, 760
See application file for complete search history.

(56) References Cited

U.S. PATENT DOCUMENTS

| 5,416,730 | A | * | 5/1995 | Lookofsky | ................... | 361/680 |
| 5,581,492 | A | * | 12/1996 | Janik | ........................ | 361/683 |
| 6,898,085 | B2 | * | 5/2005 | Haba et al. | ................... | 361/760 |
| 7,405,109 | B2 | * | 7/2008 | Burton | ........................ | 438/125 |
| 2006/0065958 | A1 | * | 3/2006 | Tsao et al. | ................... | 257/678 |

* cited by examiner

*Primary Examiner*—Tammara Peyton
(74) *Attorney, Agent, or Firm*—The Farrell Law Firm, PC

(57) ABSTRACT

An IC assembly having a routing structure mounted on a PCB of an electronic apparatus includes a central IC mounted on a central portion of the PCB; and a plurality of peripheral ICs disposed adjacent to the central IC on the PCB, wherein each of the peripheral ICs is electrically connected to the central IC through at least one routing path formed there between. The IC assembly can reduce the size and thickness of the PCB.

6 Claims, 2 Drawing Sheets

PRINTED CIRCUIT BOARD (PCB) HAVING A PLURALITY OF INTEGRATED CIRCUITS (ICS) INTERCONNECTED THROUGH ROUTING PINS IN ONE CENTRAL INTEGRATED CIRCUIT

PRIORITY

This application claims priority to an application entitled "IC Assembly Having Routing Structure Mounted On PCB" filed in the Korean Industrial Property Office on May 10, 2005 and assigned Serial No. 2005-38864, the contents of which are incorporated herein by reference.

BACKGROUND OF THE INVENTION

1. Field of the Invention

The present invention relates to an Integrated Circuit (IC) assembly having a routing structure mounted on a Printed Circuit Board (PCB), and more particularly to an IC assembly which can simplify the routing path on the PCB by using an IC mounted on a PCB.

2. Description of the Related Art

In general, Integrated Circuits (ICs) are fixed to a Printed Circuit Board (PCB) used in electronic appliances. On a PCB, ICs are connected to each other through conductive lines extending between pins and pads, etc.

The IC includes layered circuits including simple layers, cells, cell blocks, etc. Each layer includes a variety of circuit devices such as transistors, resistors and capacitors, each of which performs a specific function.

Each layer of the IC includes a plurality of circuit blocks or groups. In order to distribute power and signals between the inside and the outside of the IC, the IC uses conductors of multiple levels which distribute the power and signals between the layers.

As shown in FIG. 1, ICs 2 are connected to each other through a serial or parallel path on a PCB 1. The ICs may be laid out at a location either near to or far from a central portion of the PCB 1. Further, a power source/reference clock 3 necessary for each IC is connected to the IC through an individual routing path from a battery or power source.

When the routing paths extend over relatively long distances for connecting devices, the paths may cause coupling noise or cross-talk, which in turn causes leakage of current, thereby resulting in a bad influence on the transmission of signals.

Due to recent developments to increase processing speed, capacitor devices on the PCB may cause coupling between different signal lines of the same layer or between signal lines of different layers or may even cause short-circuiting between the signals lines.

Further, the routing may be limited in order to form a power-plane or for a necessary grounding.

The current trend is that a great number of ICs are used in addition to the existing modem and RF unit as hardware for a mobile phone, and inter-chip (chip-chip) routing is increasing in the mobile phone. Such additionally used IC devices include, for example, an application processor, a 3D-chip multimedia memory Wireless Local Area Network(WLAN), Bluetooth solution(BT)solution, digital multimedia broadcasting (DMB) solution, etc. In order to allow the increasing routing, the number of layers may be increased and the routing density may also increase. However, such an increase inevitably causes an increase in the manufacturing cost of the product, and an increase of the coupling noise between layers.

SUMMARY OF THE INVENTION

Accordingly, the present invention has been made to solve the above-mentioned problems occurring in the prior art, and an object of the present invention is to provide an IC assembly having a routing structure mounted on a PCB, which can simplify the routing path on the PCB by using an IC, thereby reducing the size and thickness of the PCB and increasing the wiring density.

It is another object of the present invention to provide an IC assembly having a routing structure mounted on a PCB, which can simplify the routing path on the PCB by using an IC, so that the IC can be used as a Field Programmable Gate Array (FPGA) for interconnection of ICs.

It is another object of the present invention to provide an IC assembly having a routing structure mounted on a PCB, which can simplify the routing path on the PCB by using an IC, thereby minimizing the coupling noise and cross-talk between ICs.

In order to accomplish these objects, there is provided an Integrated Circuit (IC) assembly having a routing structure mounted on a Printed Circuit Board (PCB) of an electronic apparatus, the IC assembly including a central IC mounted on a central portion of the PCB; and a plurality of peripheral ICs disposed adjacent to the central IC on the PCB, wherein each of the peripheral ICs is electrically connected to the central IC through at least one routing path formed between them.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

Hereinafter, preferred embodiments of the present invention will be described with reference to the accompanying drawings.

Figure 1:
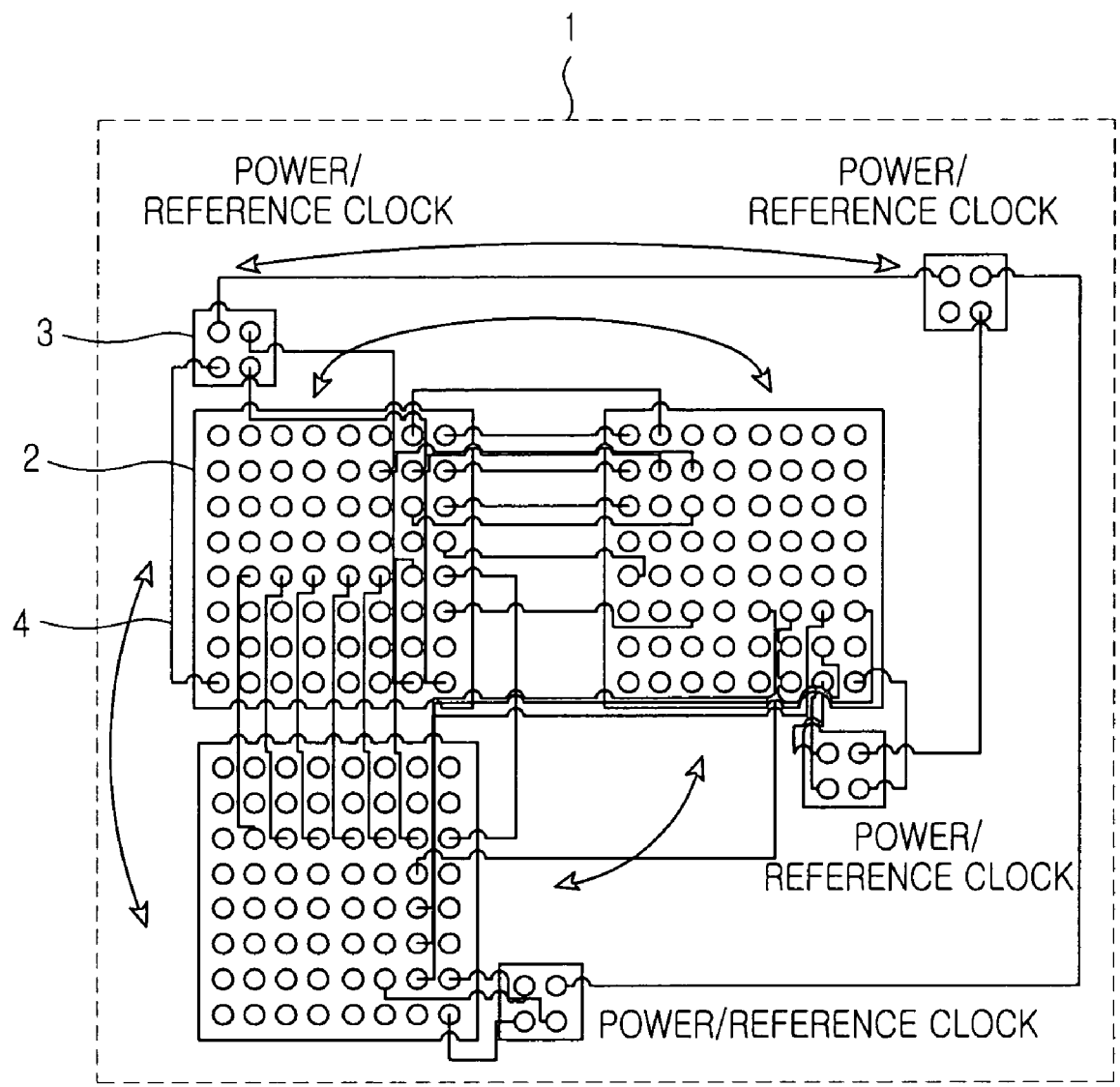
FIG. 1 is a plan view of a conventional PCB on which a plurality of ICs are routed to each other.
Figure 2:
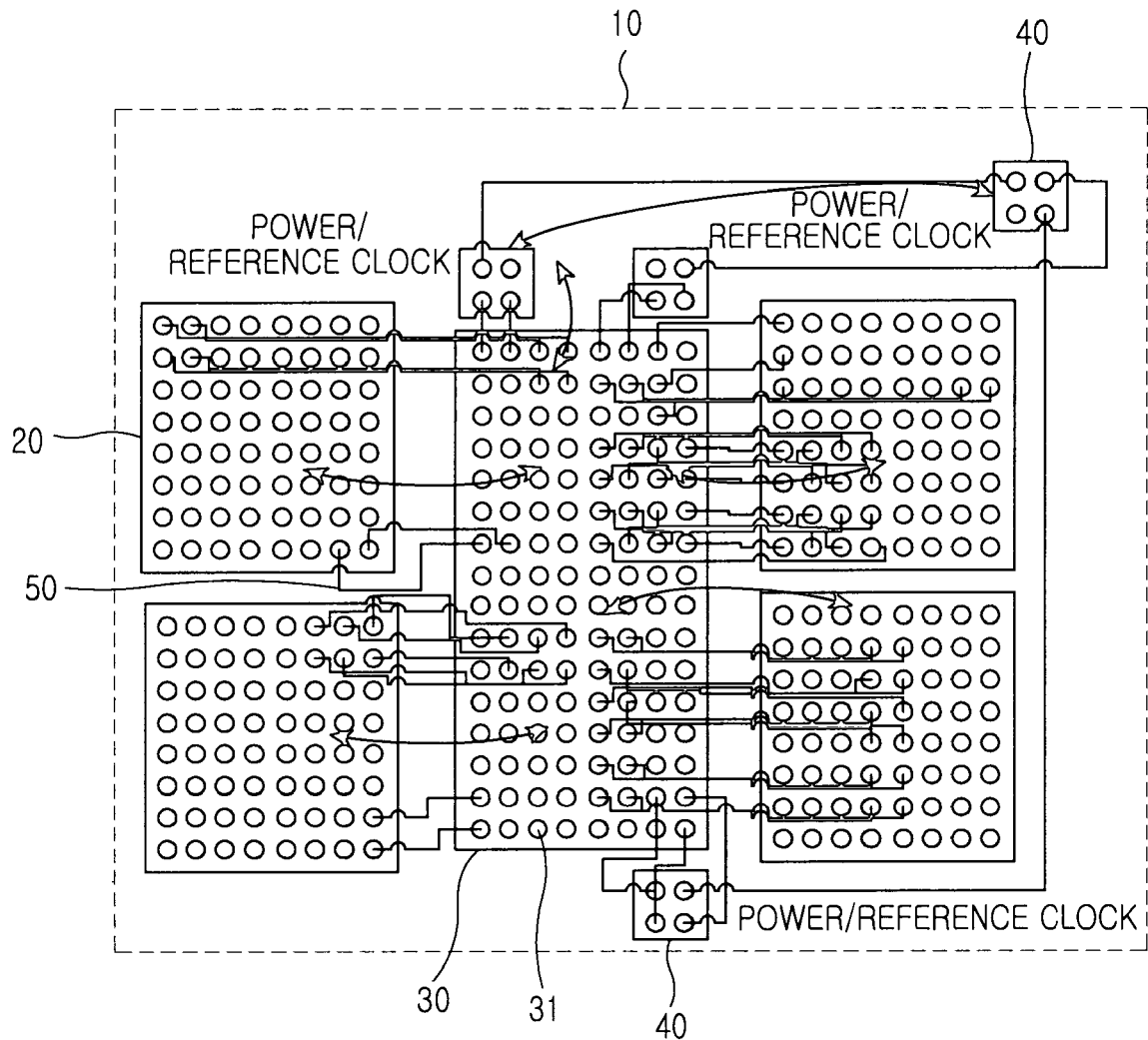
FIG. 2 is a plan view of an IC assembly having a routing structure mounted on a PCB according to the present invention.

Referring to FIG. 2, an IC assembly having a routing structure mounted on a PCB 10 according to the present invention includes a central IC 30 and a plurality of peripheral ICs 20. The central IC 30 and the peripheral ICs 20 are mounted on the PCB 10. The central IC 30 is located at a central portion among the peripheral ICs 20 and is connected with the peripheral ICs 20 in multiple ways so as to electrically interconnect the peripheral ICs 20. The central IC 30 has a plurality of routing pins 31 each of which is connected to one of the peripheral ICs 20. Each of the peripheral ICs 20 has a structure which is designed so as to allow the peripheral IC 20 to easily change its location around the central IC 30.

The central IC 30 extends in the longitudinal direction of the PCB 10 and the peripheral ICs 20 are disposed at both sides of the central IC 30, so that the peripheral ICs 20 are interconnected through the central IC 30.

At least one power/reference clock 40 is located adjacent to the central IC 30, so that the power/reference clock 40 is connected to the peripheral ICs 20 through the central IC 30 and supplies electric power to the peripheral ICs 20. Hereinafter, a fabrication process of an IC assembly having a routing structure mounted on a PCB according to the present invention will be described in detail with reference to FIG. 2. As shown in FIG. 2, the peripheral ICs 20 are disposed at right and left sides of the central IC 30 and are routed to the central IC 30. Power/reference clocks 40 are located above and below the central IC 30 and are routed to the central IC 30.

The IC assembly having the above-mentioned structure facilitates selection and connection to a probing point in the first test after its design, thereby reducing the test time.

The central IC 30 mounted on the PCB 10 facilitates layout and location change of the peripheral ICs 20 on the PCB 10.

The central IC 30 mounted on the PCB 10 can increase foot prints because it can facilitate the layout and location change of the peripheral ICs 20 on the PCB 10. That is, the IC assembly according to the present invention can simplify the shape and area of the base of the PCB 10, thereby reducing the size and thickness of the PCB and the manufacturing cost thereof.

The central IC 30 is located at a central portion between ICs having the highest signal intensity from among the peripheral ICs 20. The peripheral ICs 20 are routed to the central IC 30 through routing pins 31 provided at the circumferential part of the central IC 30 in such a sequence that the peripheral IC farthest from the central IC 30 is first routed to the central IC 30. Then, in order to supply necessary power to each of the peripheral ICs 20, the power/reference clocks 40 are routed directly to the central IC 30, which in turn routes the power/reference clock signal to the peripheral ICs 20.

Such a proper layout of the central IC 30 and the peripheral ICs 20 as described above can be designed by a computer (not shown). In such a design, a Field Programmable Gate Array (FPGA) may be fabricated and used before the central IC 30 is actually fabricated.

The central IC 30 includes only signal lines and power lines without an active device. Therefore, it is possible to minimize the schedule variance. If necessary, the central IC 30 may include a microphone and switches.

As described above, the IC assembly according to the present invention can simplify the routing path by using an IC mounted to a PCB of an electronic apparatus. Further, the IC assembly according to the present invention can reduce the size and thickness of a PCB, can reduce the manufacturing cost of the product, and can increase the wiring density.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A Printed Circuit Board (PCB) having a plurality of Integrated Circuits (ICs) comprising:
    a central IC having a plurality of routing pins, the routing pins intended to be electrical connections between the plurality of ICs; and
    a plurality of peripheral ICs disposed adjacent to the central IC, wherein each of the peripheral ICs is electrically interconnected through the routing pins in the central IC.

2. The PCB of claim 1, wherein the peripheral ICs are disposed at locations which can be easily changed around the central IC.

3. The PCB of claim 1, wherein the central IC extends in a longitudinal direction of the PCB and the peripheral ICs disposed round the central IC are routed to each other through the central IC.

4. The PCB of claim 1, wherein at least one power/reference clock is located adjacent to the central IC and connected to the peripheral ICs through the central IC.

5. The PCB of claim 1, wherein the central IC includes lines for passage of power and clock signals.

6. The PCB of claim 1, wherein the peripheral ICs are disposed around the central IC in a plurality of ways.

* * * * *